United States Patent
Kang

(10) Patent No.: US 8,018,777 B2
(45) Date of Patent: Sep. 13, 2011

(54) FLASH MEMORY DEVICE FOR ADJUSTING NON-SELECTED WORD LINE VOLTAGE DURING READING

(75) Inventor: Yong-Hoon Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 293 days.

(21) Appl. No.: 12/314,651

(22) Filed: Dec. 15, 2008

(65) Prior Publication Data

US 2009/0168511 A1 Jul. 2, 2009

(30) Foreign Application Priority Data

Dec. 26, 2007 (KR) ........................ 10-2007-0137707

(51) Int. Cl.
*G11C 11/34* (2006.01)
*G11C 16/06* (2006.01)

(52) U.S. Cl. ......... 365/185.23; 365/185.02; 365/185.17; 365/185.18

(58) Field of Classification Search ............. 365/185.18, 365/185.23, 185.02
See application file for complete search history.

(56) References Cited

U.S. PATENT DOCUMENTS

| | | | | |
|---|---|---|---|---|
| 6,819,592 | B2 * | 11/2004 | Noguchi et al. | 365/185.17 |
| 7,009,881 | B2 * | 3/2006 | Noguchi | 365/185.17 |
| 7,203,093 | B2 | 4/2007 | Nguyen | |
| 7,272,043 | B2 * | 9/2007 | Liao et al. | 365/185.18 |
| 7,525,841 | B2 * | 4/2009 | Aritome | 365/185.17 |
| 7,561,469 | B2 * | 7/2009 | Aritome | 365/185.18 |
| 7,684,243 | B2 * | 3/2010 | Aritome et al. | 365/185.17 |
| 2006/0203553 | A1 | 9/2006 | Roohparvar | |
| 2007/0153573 | A1 | 7/2007 | Fong et al. | |
| 2010/0149877 | A1 * | 6/2010 | Kim et al. | 365/185.23 |
| 2010/0315881 | A1 * | 12/2010 | Kim et al. | 365/185.23 |

* cited by examiner

*Primary Examiner* — Tuan T Nguyen
*Assistant Examiner* — R Lance Reidlinger
(74) *Attorney, Agent, or Firm* — Harness, Dickey & Pierce

(57) ABSTRACT

Disclosed is a flash memory device including a memory cell array having memory cells arranged at intersections of word lines and bit lines, such that one bit line is associated with a plurality of memory cells connected in series, a voltage generator configured to generate at least a first selection voltage, a row selection circuit configured to drive the non-selected word lines based on at least the first non-selected voltage, and a control logic circuit configured to control the voltage generator and the row selection circuit, such that the voltage generator generates at least the first non-selection voltage based on a location of a selected memory cell in the plurality of memory cells.

4 Claims, 12 Drawing Sheets

FLASH MEMORY DEVICE FOR ADJUSTING NON-SELECTED WORD LINE VOLTAGE DURING READING

PRIORITY STATEMENT

This U.S. non-provisional patent application claims priority under 35 U.S.C. §119 of Korean Patent Application No. 10-2007-0137707 filed on Dec. 26, 2007, the entire contents of which are incorporated herein by reference.

BACKGROUND

1. Field

Example embodiments relate to flash memory devices (e.g., flash memory devices and methods capable of improving the reliability of a reading operation).

2. Description of Conventional Art

Flash memory (e.g. NAND flash memory and NOR flash memory) is electronically erasable and writeable. Thus, flash memory devices may be used as system programming tools or subsidiary storage units.

NAND flash memory includes a memory cell array which functions as an information reservoir. The memory cells may be arranged at intersections of word lines and bit lines. Such an arrangement organizes the memory cell array into a plurality of cell strings (e.g. NAND strings). Also, NAND flash memory may include a page buffer circuit to store or read data from the memory cell array. A memory cell in NAND flash memory may be erased or programmed using Fowler-Nordheim (F-N) tunneling current.

During operation of a flash memory device, a reading operation is carried out in the flash memory to find out whether a particular memory cell is programmed or erased. During the reading operation, a word line is selected and a bit line is precharged to a specific voltage level. The precharging voltage level depends on the condition of the memory cell, which is coupled to the selected word line for a desired time (or, alternatively, a predetermined time). The bit line goes to a low level (e.g., the ground voltage level) if the memory cell coupled to the selected word line has been erased (i.e., on-cell), or maintains the precharging voltage level if the memory cell has been programmed (i.e., off-cell).

As the number of programming/erasing cycles increases, the programming characteristics of the memory cells may degrade. Memory cell degradation reduces the amount of current flowing through the memory cells. The memory cell with the worst programming characteristics is called a 'worst on-cell'. If a selected memory cell is the worst on-cell, current flowing through the selected memory cell is at its lowest point.

Generally, turned-on memory cells have their own resistance values in correspondence with their channel widths. Furthermore, the resistance values of the turned-on memory cells are inversely proportional to gate-source potential gaps. During a reading operation, memory cells coupled to a non-selected word line are turned on. As a consequence, turning on the memory cells coupled to non-selected word lines causes the memory cells to have resistance. The resistance impacts the current flowing though the cell string, which connects the memory cell of a selected word line to deselected memory cells. The cell string connecting the non-selected memory cells to the selected memory cell causes the deselected memory cells to act as resistors connected in series.

A memory cell may be a memory cell transistor in which the current flowing through the memory cell transistor is proportional to the gate-source potential gap. If the non-selected memory cells are coupled to a source contact of a selected memory cell transistor, the source resistance may affect the current and voltage applied to the selected memory cell transistor. The source resistance is the combined resistance value caused by all the non-selected memory cells in a cell string connected to the source channel of a selected memory cell. A rise in the source resistance value leads the source voltage of the memory cell transistor to rise, which reduces the gate-source potential gap of the memory cell transistor. Since the current flowing through a turned-on memory cell is proportional to the gate-source potential gap, an increase in the source resistance value results in a reduction in the amount of current flowing through the selected memory cell transistor. The decrease in current flow is amplified with each additional deselected memory cell. Also, if the selected memory cell transistor is simultaneously the worst on-cell, the precharging voltage level of a bit line will not be able to discharge at a predetermined time, degrading the reliability of the operation.

SUMMARY

Example embodiments provide a flash memory device and/or method of operation with improved reliability during a reading operation.

In an example embodiment, a flash memory may include a memory cell array, a voltage generator, a row selection circuit, and a control logic circuit. The memory cell array may have memory cells arranged at intersections of word lines and bit lines such that at least one bit line is associated with a plurality of memory cells connected in series. The voltage generator may be configured to generate a selection voltage and at least a first non-selection voltage. The row selection circuit may be configured to drive the word lines based on at least the selection voltage and the first non-selection voltage. The control logic circuit may be configured to control operation of the voltage generator and the row selection circuit such that the voltage generator generates at least the first non-selection voltage based on a location of a selected memory cell in the plurality of memory cells, the selected memory cell being a memory cell in the plurality of memory cells connected to the word line receiving the selection voltage.

In another example embodiment, a flash memory device may include a memory cell array, a voltage generator, a row selection circuit, and a control logic circuit. The memory cell array may have memory cells arranged at intersections of word lines and bit lines such that at least one bit line is associated with a plurality of memory cells connected in series. The voltage generator may be configured to generate a selection voltage, a first non-selection voltage, and a second non-selection voltage. The row selection circuit may be configured to drive the word lines based on the selection voltage, the first non-selection voltage, and the second non-selection voltage. The control logic circuit may be configured to control operation of the voltage generator and row selection circuit such that the voltage generator generates the first non-selection voltage and second non-selection voltage based on a location of a selected memory cell in the plurality of memory cells, the selected memory cell being a memory cell in the plurality of memory cells connected to the word line receiving the selection voltage.

In another example embodiment, a flash memory may include a memory cell array, a voltage generator, a row selection circuit, and a control logic circuit. The memory cell array may have memory cells arranged at intersections of word lines and bit lines such that at least one bit line is associated with a plurality of memory cells connected in series. The voltage generator may be configured to generate a selection voltage and at least a first non-selection voltage. The row selection circuit may be configured to drive the word lines based on the selection voltage and the first non-selection voltage. The control logic circuit may be configured to control operation of the voltage generator and the row selection circuit such that the voltage generator generates the first non-selection voltage based on the number of memory cells subsequent to a selected memory cell, the selected memory cell being a memory cell in the plurality of memory cells connected to the word line receiving the selection voltage. The control logic circuit may be also configured to control operation of the voltage generator and the row selection circuit such that the voltage generator generates a second non-selection voltage based on the number of memory cells prior to a selected memory cell.

BRIEF DESCRIPTION OF THE FIGURES

Non-limiting and non-exhaustive example embodiments are described in the following figures, wherein reference numerals refer to like parts throughout the various figures unless otherwise specified. In the figures.

DETAILED DESCRIPTION

Figure 1:
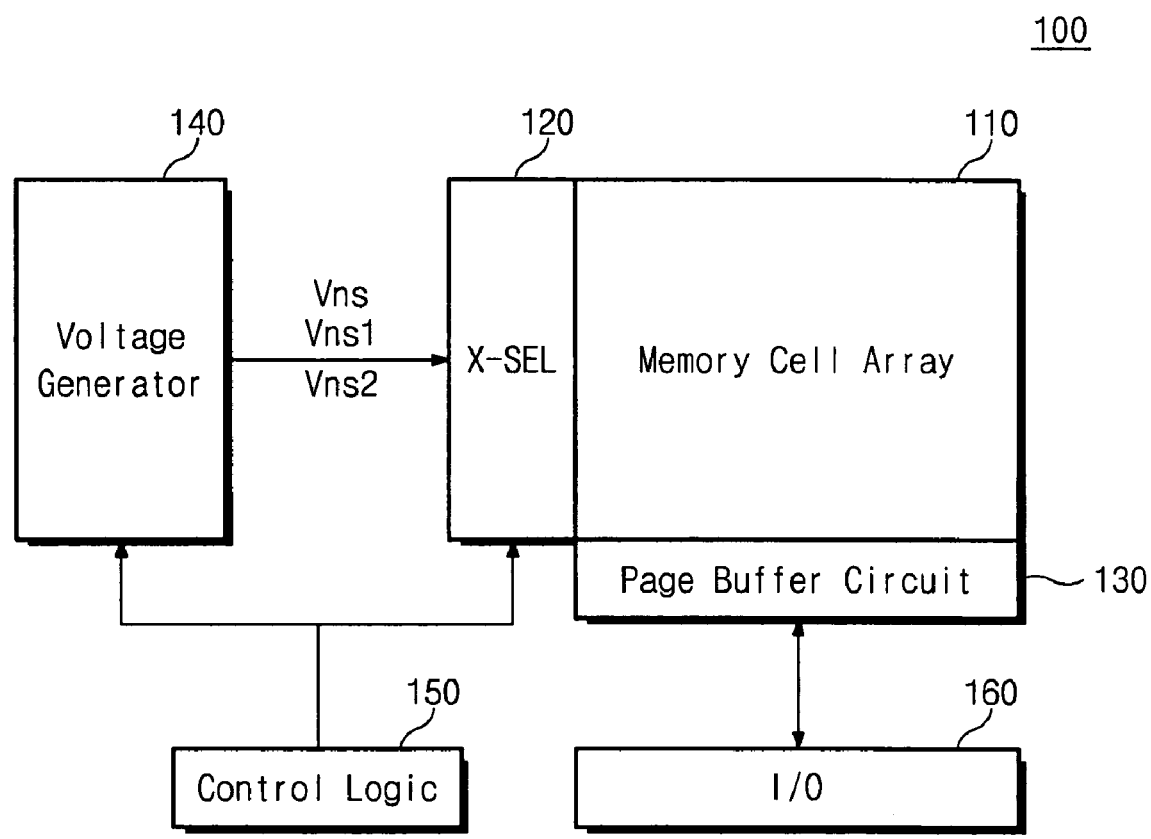
FIG. 1 is a block diagram of a flash memory device according to an example embodiment of the present invention.

Example embodiments may be embodied in many different forms and should not be construed as being limited to the embodiments set forth herein; rather, these embodiments may be provided so that this disclosure will be thorough and complete, and will fully convey the concept of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of a flash memory device 100 according to an example embodiment. Flash memory device 100 is comprised of a memory cell array 110, a row selection circuit (X-SEL) 120, a page buffer circuit 130, a voltage generator 140, a control logic circuit 150, and an input/output circuit 160.

Figure 2:
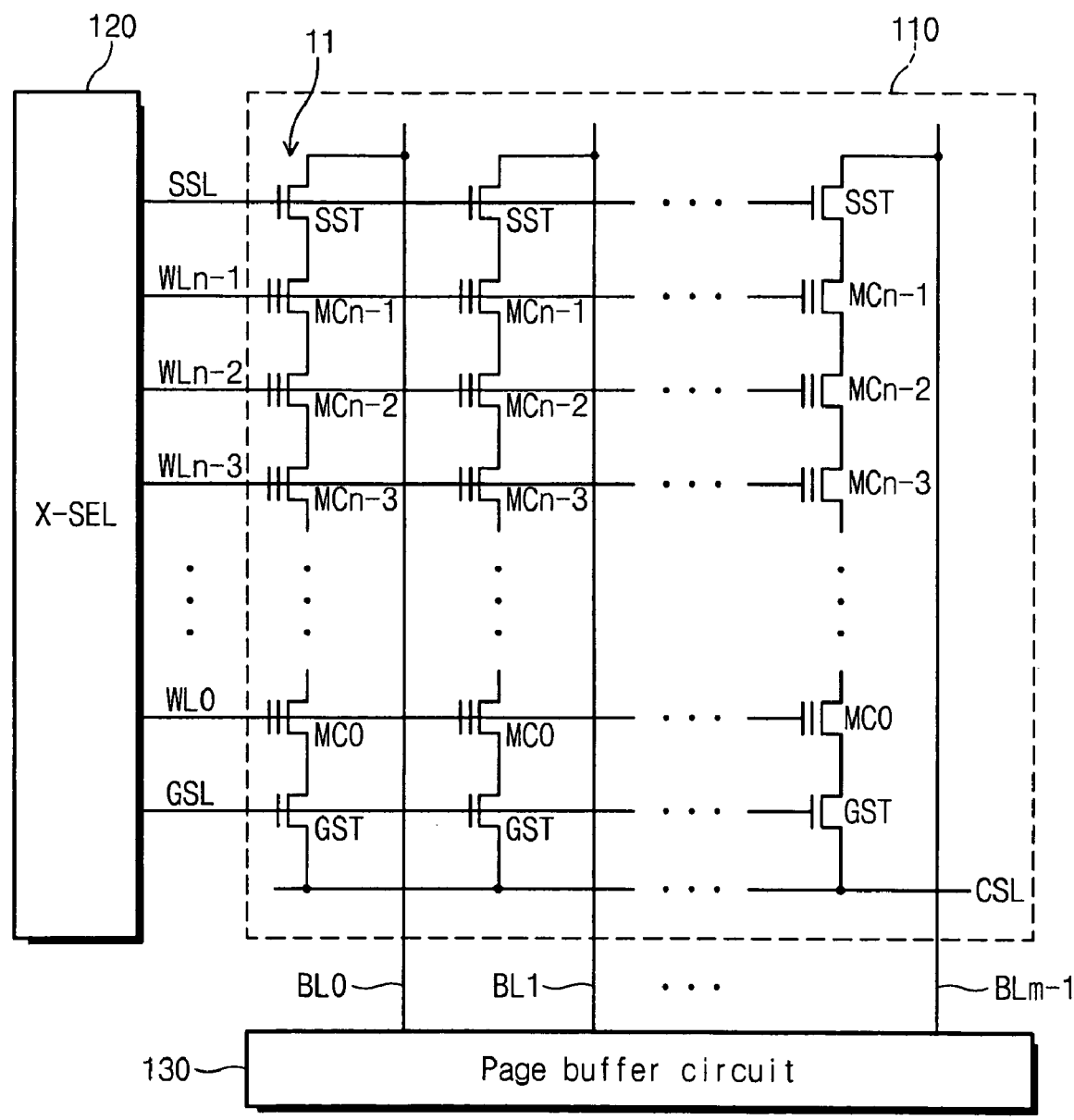
FIG. 2 is a circuit diagram of the memory cell array example embodiment shown in FIG. 1.

FIG. 2 is a circuit diagram of memory cell array 110 of the example illustrated in FIG. 1. The memory cell array 110 comprises a plurality of memory blocks (not shown). Each memory block includes a plurality of cell strings (e.g. NAND strings), each cell string connected to one of bit lines BL0~BLm-1. Cell string 11 is one such cell string. The cell string 11 includes a string selection transistor SST, a ground selection transistor GST, and a plurality of memory cells (or memory cell transistors) MC0~MCn. The plurality of memory cells MC0~MCn may be connected in a series. The cell string 11 connects each memory cell therein to the bit line BL0. In the cell string 11, the string selection transistor SST is coupled to a string selection line SSL and the ground selection transistor GST is coupled to a ground selection line GSL. The memory cells MC0~MCn-1 are correspondingly coupled to word lines WL0~WLn-1. The memory cells of the cell string are made of floating gate transistors. The control gates of the floating gate transistors are each connected to the word lines WL0~WLn-1. The string selection line SSL, the word lines WL0~WLn-1, and the ground selection line GSL are electrically connected to the row selection circuit 120. The row selection circuit 120 selects one of the word lines in response to a row address. In a programming operation, row selection circuit 120 supplies a program voltage to a selected word line, while supplying a pass voltage to non-selected word lines. In a reading operation, the row selection circuit 120 may supply a ground voltage to a selected word line (Vsel), while supplying at least one non-selection voltage (e.g. Vns, Vns1, and Vns2) to the non-selected memory cell(s). The program, pass, and read operation voltages are higher than the power source voltage of the flash memory device. As shown, other cell strings having the same structure as cell string 11 are connected to bit lines BL1~BLm-1.

Bit lines BL0~BLm-1 are connected to the page buffer circuit 130. During a reading/verification operation, the page buffer circuit 130 senses data from the memory cells of a selected word line by way of bit lines BL0~BLm-1. Also, during a programming operation, data to be programmed in memory cells MC0~MCn-1 is loaded into the page buffer circuit 130. The page buffer circuit 130 selectively supplies power source voltage (e.g. program-inhibited voltage) or ground voltage (e.g. the program voltage) to the bit lines BL0~BLm-1 in accordance with the loaded data. By doing this, the data loaded into the page buffer circuit 130 is programmed into the memory cells of the selected word line, the selected word line being designated as 'selected' by the row selection circuit 120. The page buffer circuit 130 includes a plurality of page buffers each coupled to a pair of bit lines. The page buffer circuit 130 may include page buffers respectively corresponding to each of bit lines BL0~BLm-1.

During a reading operation, the control logic circuit 150 controls operation of the voltage generator 140 such that the voltage generator 140 generates the non-selection voltages Vns, Vns1, and Vns2. Vns is referred to as 'reference non-selection voltage' and is the conventional voltage applied to non-selected word lines during a reading operation. Vns1 and Vns2 are respectively referred to as the 'first non-selection voltage' and the 'second non-selection voltage.' The first and second non-selection voltages (Vns1 and Vns2) may be sequentially stepped up or down by a desired level (or, alternatively, a predetermined level), in correspondence with the location of a selected word line or the number of non-selected memory cells in a cell string. The first non-selection voltage Vns1 is higher than the conventional non-selection voltage Vns. The second non-selection voltage Vns2 is lower than conventional non-selection voltage Vns. The first non-selection voltage Vns1 varies between voltage levels Vns1_1~Vns1_K, with Vns1_1 being the lowest and Vns1_K being the highest. Also, the second non-selection voltage Vns2 varies between voltage levels Vns2_1~Vns2_L, with Vns2_1 being the lowest and Vns2_L being the highest. (The relationship between the voltage levels is discussed in further detail below, alongside FIGS. 3 through 9.) The voltage generator 140 provides row selection circuit 120 with at least one of the non-selection voltages Vns, Vns1, and Vns2.

The control logic circuit 150 may also control the overall function of the flash memory device 100. During the reading operation, the control logic circuit 150 can enable the voltage generator 140 to generate the selection voltage Vsel, which may be 0 V. The control logic circuit 150 can also enable the voltage generator 140 to generate at least one of the non-selection voltages Vns, Vns1, and Vns2. The control logic circuit 150 also enables the row selection circuit 120 to selectively apply the voltages Vsel, Vns, Vns1, and Vns2 to the non-selected word lines in correspondence with the location of a selected word line or the number of non-selected memory cells in a cell string.

The input/output circuit 160 provides external data into the page buffer circuit 150 during the programming operation and outputs sensed data through the page buffer circuit 150 during a reading operation.

The voltage generator 140 increases the level of the first non-selection voltage Vns1 as a selected word line is located closer to the string selection line SSL. The row selection circuit 120 applies this increased first non-selection voltage Vns1 to the word lines associated with memory cells subsequent to the selected memory cell in the plurality of memory cells (subsequent non-selected word lines). In other words, as a selected word line is located closer to the string selection line SSL, there is a corresponding increase of the first non-selection voltage Vns1 applied to the subsequent non-selected word lines. The increased first non-selection voltage Vns1 enlarges the gate-source potential gaps of the non-selected memory cells serially connected to the selected memory cell. This causes the source resistance of the selected memory cell to become smaller, which in turn increases the amount of current flowing through the selected memory cell. As such, if a selected memory cell is the worst on-cell, the bit-line precharging voltage can be discharged to a low level in a desired time (or, alternatively, a predetermined time), thereby improving the reliability of the flash memory device 100 during a reading operation.

Also, the voltage generator 140 decreases the level of the second non-selection voltage Vns2 as a selected word line is located closer to the string selection line SSL. The row selection circuit 120 applies the decreased second non-selection voltage to the word lines associated with memory cells prior to the selected memory cell in the plurality of memory cells (prior non-selected word line). This is for the purpose of preventing read disturbance caused by memory cells serially connected to the selected memory cell (discussed in further detail below, alongside FIGS. 7-9).

FIGS. 3 through 6 are circuit diagrams showing multiple bias conditions applied to non-selected word lines based on the location of a selected word line in accordance with an example embodiment. The bias conditions applied to the non-selected word lines, as shown in FIGS. 3 through 6, may also be based on the number of non-selected memory cells subsequent to a selected memory cell, rather than the location thereof. Arbitrary cell strings in memory cell array 110 are shown for descriptive purposes. Also, the range Vns1_1~Vns1_K illustrates the varying voltage levels of first non-selection voltage Vns1. The voltage levels in the range Vns1_1~Vns1_K increase incrementally from Vns1_1 to Vns1_K. Finally, an arbitrary word line is selected to illustrate a reading operation.

Figure 3:
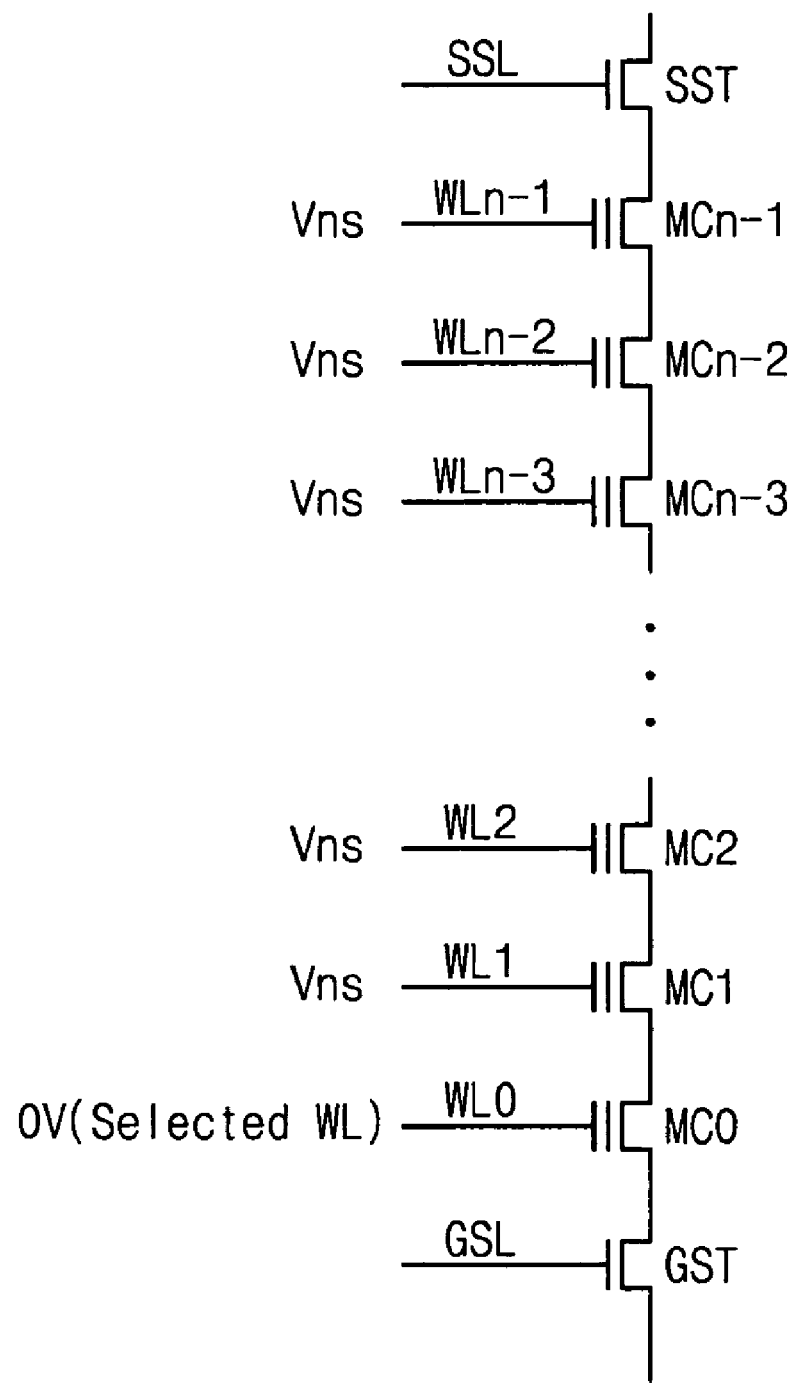
FIGS. 3 through 6 are circuit diagrams showing bias conditions with a selection voltage applied to a selected word line and a first non-selection voltage applied to non-selected word lines according to an example embodiment.
Figure 4:
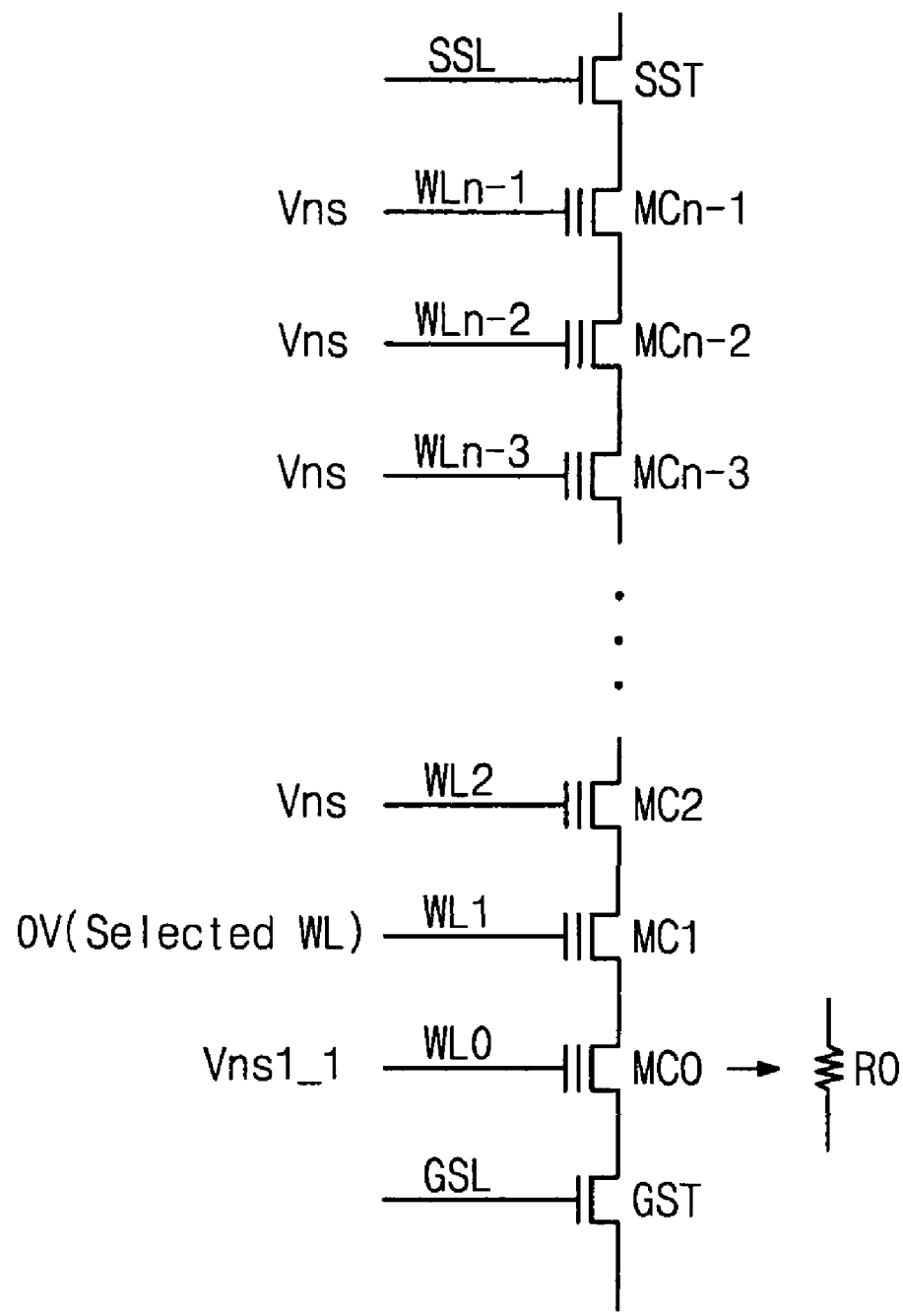
Figure 5:
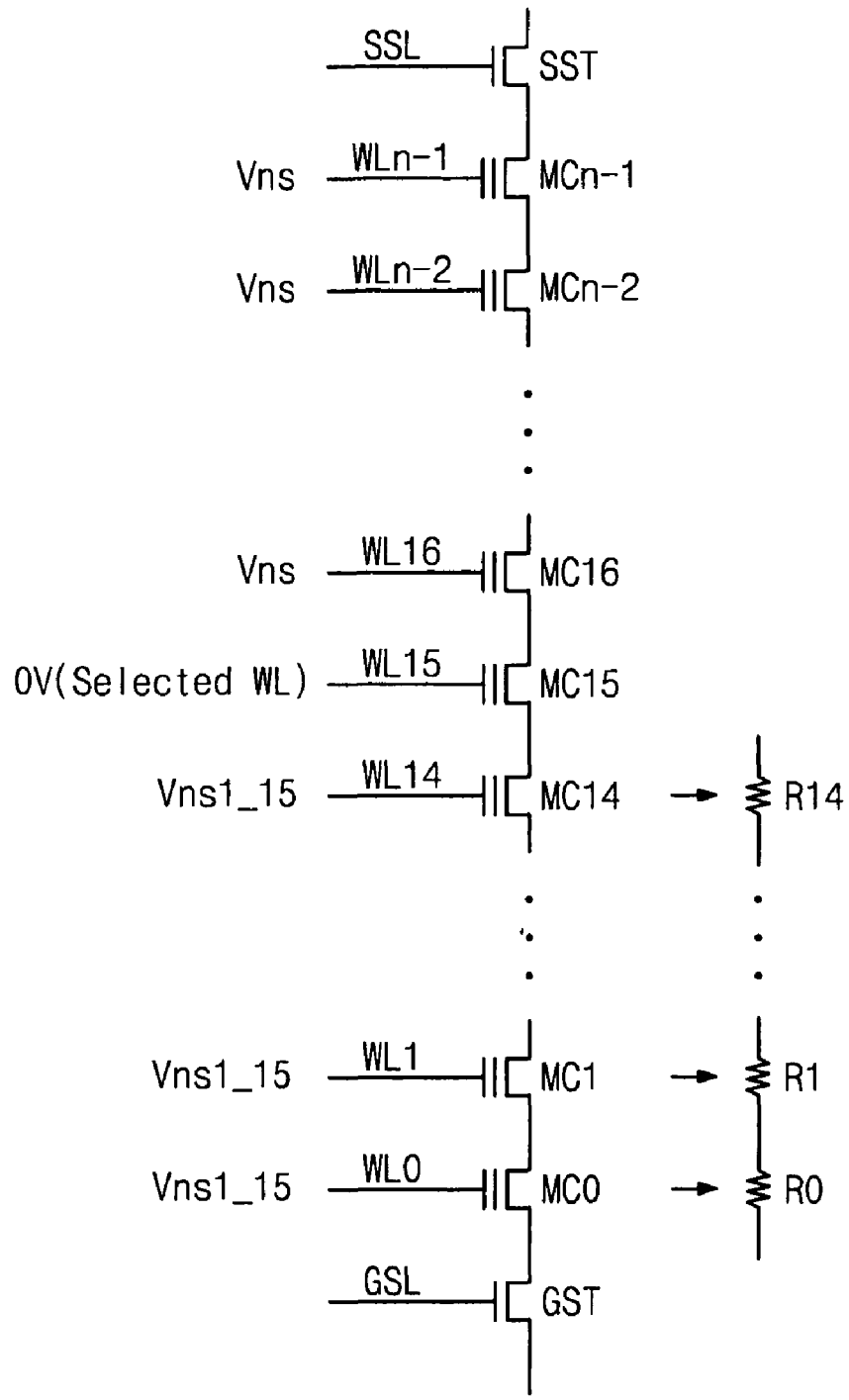
Figure 6:
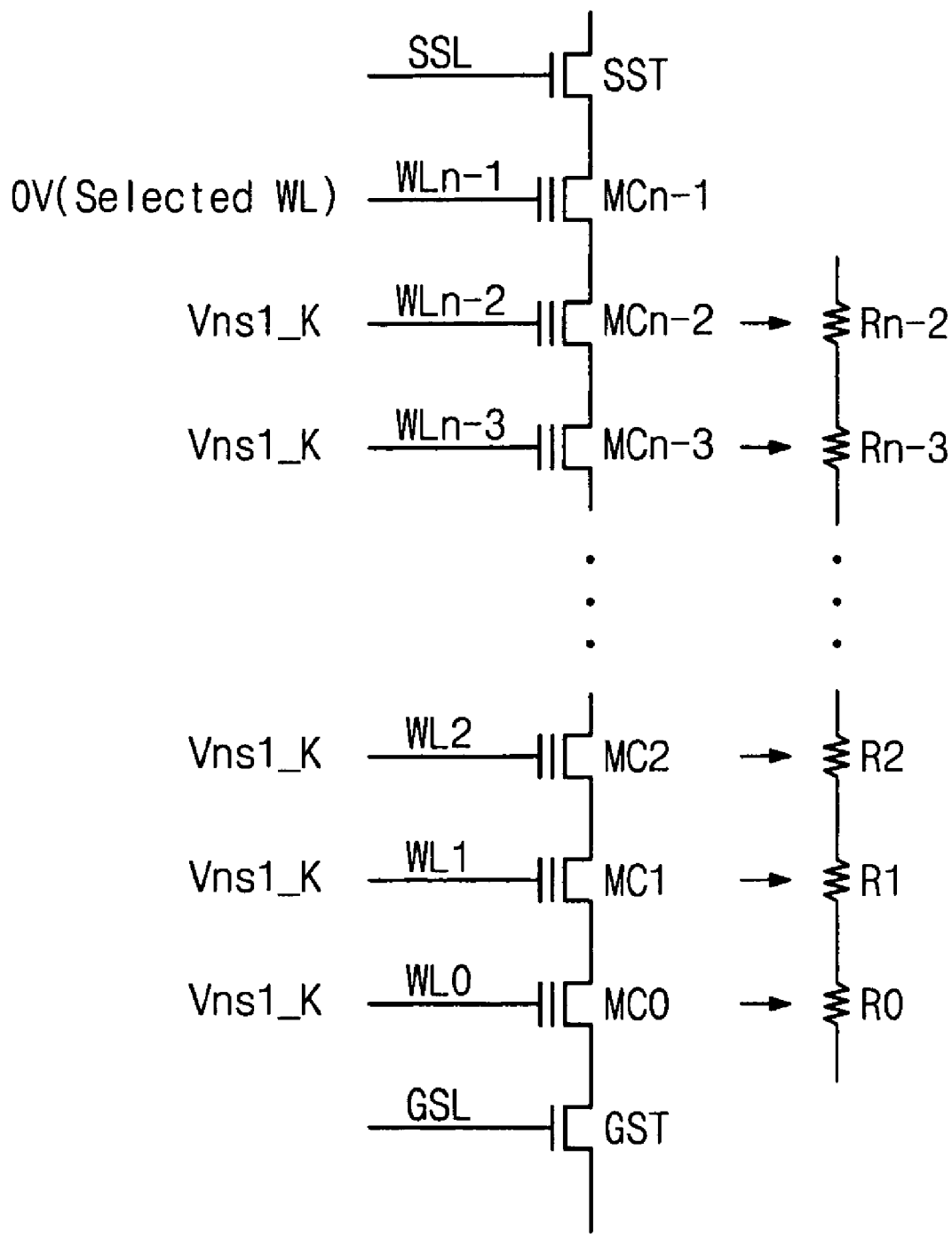

FIG. 3 illustrates a bias condition applied to non-selected word lines if the selected word line is WL0, which is adjacent to the ground selection line GSL. FIGS. 4 through 6 show different bias conditions as the selected word line is located closer to string selection line SSL.

During a reading operation, non-selected memory cells serially connected to a source of a selected memory cell act as resistors. The non-selected memory cells include the memory cells coupled to word lines subsequent to the selected memory cell, as well as the memory cells coupled to word lines prior to the selected memory cell. If the selected word line is adjacent to the string selection line SSL, the number of non-selected memory cells serially connected to the selected memory cell is the largest possible number. Since an increase in the number of non-selected memory cells subsequent to the selected memory cell leads to a corresponding increase in the amount of resistance in cell string 11, a selected word line adjacent to string selection line SSL causes the source resistance of the selected memory cell to also be at its maximum.

Row selection circuit 120 applies the non-selection voltage to the non-selected word lines, where the voltage amount depends on the location of the selected word line. A word line is selected by the control logic circuit 150. The closer the selected word line is located to the string selection line SSL, the greater the source resistance of the selected memory cell. Correspondingly, the voltage generator 140 increases the level of the first non-selection voltage Vns1 as the selected word line is located closer to string selection line SSL. Row selection circuit 120 applies the first non-selection voltage to the word lines subsequent to the selected memory cell while applying the conventional non-selection voltage to word line prior to the selected memory cell. The word lines subsequent to the selected memory cell are supplied with higher levels of the first non-selection voltage Vns1 as the selected word line gets closer to the string selection line SSL, or alternatively, as the number of non-selected memory cells subsequent to the selected memory cell increases.

If the first non-selection Vns1 voltage applied to the word lines subsequent to a selected memory cell increases in level, the gate-source potential gaps of the non-selected memory cells serially connected to the selected memory cell deepen. Since the source resistance caused by individual non-selected memory cells is inversely proportional to the gate-source potential gaps of the same, the resistance of the non-selected memory cells is lowered. Namely, source resistance connected to the selected memory cell becomes smaller. This smaller source resistance causes the amount of current loss caused by the subsequently connected non-selected memory cells to diminish.

FIG. 3 illustrates a bias condition applied to the word lines corresponding with the non-selected memory cells if the selected word line is WL0, which is adjacent to the ground selection line GSL. In such an event, there is no word line subsequent to the selected word line WL0. Thus, there also is no component of source resistance to the selected memory cell by a non-selected memory cell. Consequently, there is no reduction of cell string current due to source resistance. In this case, conventional non-selection voltage Vns is applied to word lines WL1~WLn-1, which are associated with the memory cells prior to the selected memory cell MC0. The selection voltage Vsel is applied to the word line corresponding with the selected memory cell, the selection voltage Vsel may be 0 V, as illustrated in FIGS. 3 through 9.

On the other hand, as shown in FIG. 4, if the selected word line is the word line WL1, the word line associated with the memory cell subsequent to the selected memory MC0 is the word line WL0. In such an event, there exists source resistance caused by the non-selected memory cell MC0, which is coupled to the subsequent non-selected word line WL0. The subsequent non-selected word line WL1 causes a current drop and reduces the amount of current flowing through the selected memory cell MC1. But since there is only one subsequent memory cell MC0, source resistance is small and any current drop caused by the subsequent cell MC0 may also be low. In such a case, the row selection circuit 120 applies a first non-selection voltage Vns1_1, which is the lowest voltage in the possible range of first non-selection voltage Vns1_1~Vns1_K. The level of first non-selection voltage Vns1_1 corresponds with the resistance R0 manifested by the non-selected memory cell M0. The first non-selection voltage Vns1_1 lowers the source resistance caused by the non-selected memory cell MC0. Although first non-selection voltage Vns1_1 is a slight increase over the conventional non-selection voltage Vns, the small current drop caused by resistance R0 of non-selected memory cell M0 is lessened. The conventional non-selection voltage Vns is applied to the word lines prior to the selected word lines, these prior word lines are word lines WL2~WLn-1.

FIG. 5 illustrates a bias condition applied to non-selected word lines when the selected word line is word line WL15, which is between the string selection line SSL and ground selection line GSL. The word lines associated with memory cells subsequent to the selected memory MC15 are the word lines WL0~WL14. The non-selected memory cells MC0~MC14 are coupled to the subsequent non-selected word lines WL0~WL14. In such a situation, the source resistance of selected memory cell MC15 becomes larger than the source resistance of FIG. 4 due to the combined resistance values R0~R14 of non-selected memory cells MC0~MC14. The sum of resistance values R0~R14 is the source resistance. The increased source resistance in FIG. 4 drops the current flow by a larger magnitude than the source resistance in FIG. 3. In light of the increased source resistance, the row selection circuit 120 applies a greater first non-selection voltage Vns1_15 to the subsequent word lines WL0~WL14, which correlates with greater source resistance. Applying the increased non-selection voltage Vns1_15 reduces the source resistance caused by the non-elected memory cells MC0~MC14, which lessens the current drop caused by the same. The conventional non-selection voltage Vns is applied to the prior word lines WL16~WLn-1.

In still another illustration, FIG. 6 illustrates a bias condition applied to the non-selected word lines when the selected word line is word line WLn-1, which is the word line immediately adjacent to the string selection line SSL. Selection of this word line means that the word lines associated with memory cells subsequent to the selected memory cell MCn-1 are word lines WL0~WLn-2. Coupled to subsequent word lines WL0~WLn-2 are non-selected memory cells MC0~MCn-2. In such a situation, the source resistance to selected memory cell WLn-1 may be at its maximum due to the combined resistance values R0~Rn-2 of non-selected memory cells MC0~MCn-2. Since the source resistance of the selected memory cell MCn-1 is at its largest, the current drop to the selected memory cell MCn-1 may be at its maximum.

In a case such as that of FIG. 6, the voltage level of the first non-selection voltage will be at its highest level. The non-selection voltage Vns1_K is the highest voltage amount in the range of first non-selection voltages Vns1_1~Vns1_K. The control circuit 150 controls row selection circuit 120 such that the row selection circuit 120 applies the first non-selection voltage Vns1_K to the subsequent word lines WL0~WLn-2. As the first non-selection voltage Vns1_K is applied to the subsequent word lines WL0~WLn-2, the source resistance (the combined resistance of R0~Rn-2) is reduced, thereby reducing the current drop caused by the source resistance.

In short, FIGS. 3-6 illustrate that according to the location of a selected word line or the number of non-selected memory cells subsequent to the selected memory cell, a certain non-selection voltage is correspondingly applied to the word lines associated with memory cells subsequent to the selected memory cell, which reduces source resistance to the selected memory cell. This increases the current flow through the selected memory cell. Thus, the reliability of the reading operation in flash memory device 100 is raised.

The highest level of the non-selection voltage applied to non-selected word lines should be set to a level that prevents soft-programming of memory cells in an erased state (erased cells) caused by repetitive reading operations. For example, if a voltage higher than the power source voltage is continuously applied to the control gate of a memory cell, a weak flow of electrons could be generated between the floating gate and a channel of the memory cell, even if the voltage is not high enough to induce an F-N tunneling effect. In such a scenario, if the memory cell coupled to a non-selected word line is an erased cell, the erased cell can be subject to soft programming. The threshold voltage of an erased cell subject to soft programming may be higher than the ground voltage. If this is true, the erased cell subject to soft programming could be inadvertently sensed as an on-cell, instead of an off-cell. This degrades the reliability of the reading operation. This phenomenon is known as 'read disturbance.'

Figure 7:
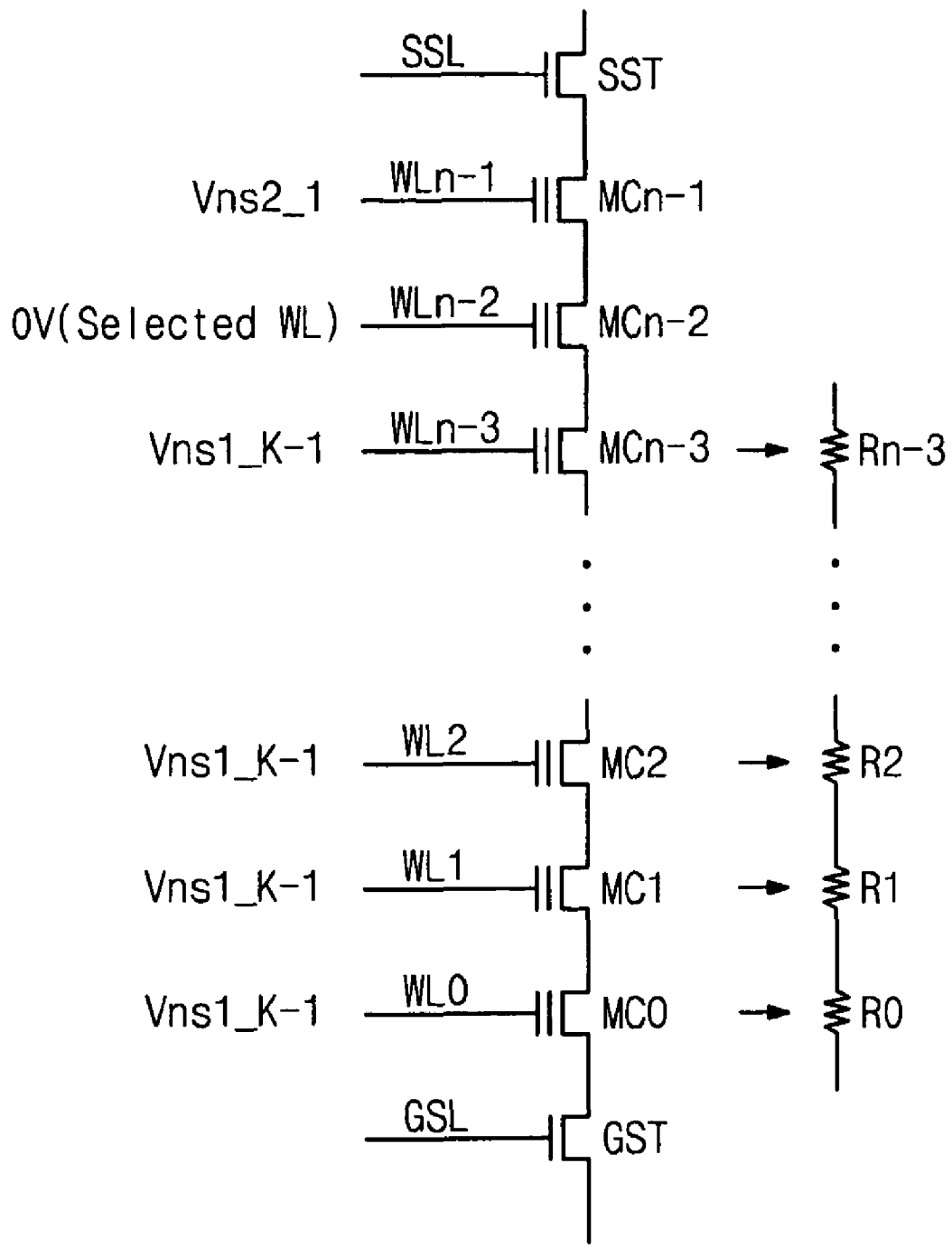
FIGS. 7 through 9 are circuit diagrams showing a bias condition with a selection voltage applied to a selected word line, and a first and second non-selection voltage applied to non-selected word lines according to an example embodiment.
Figure 8:
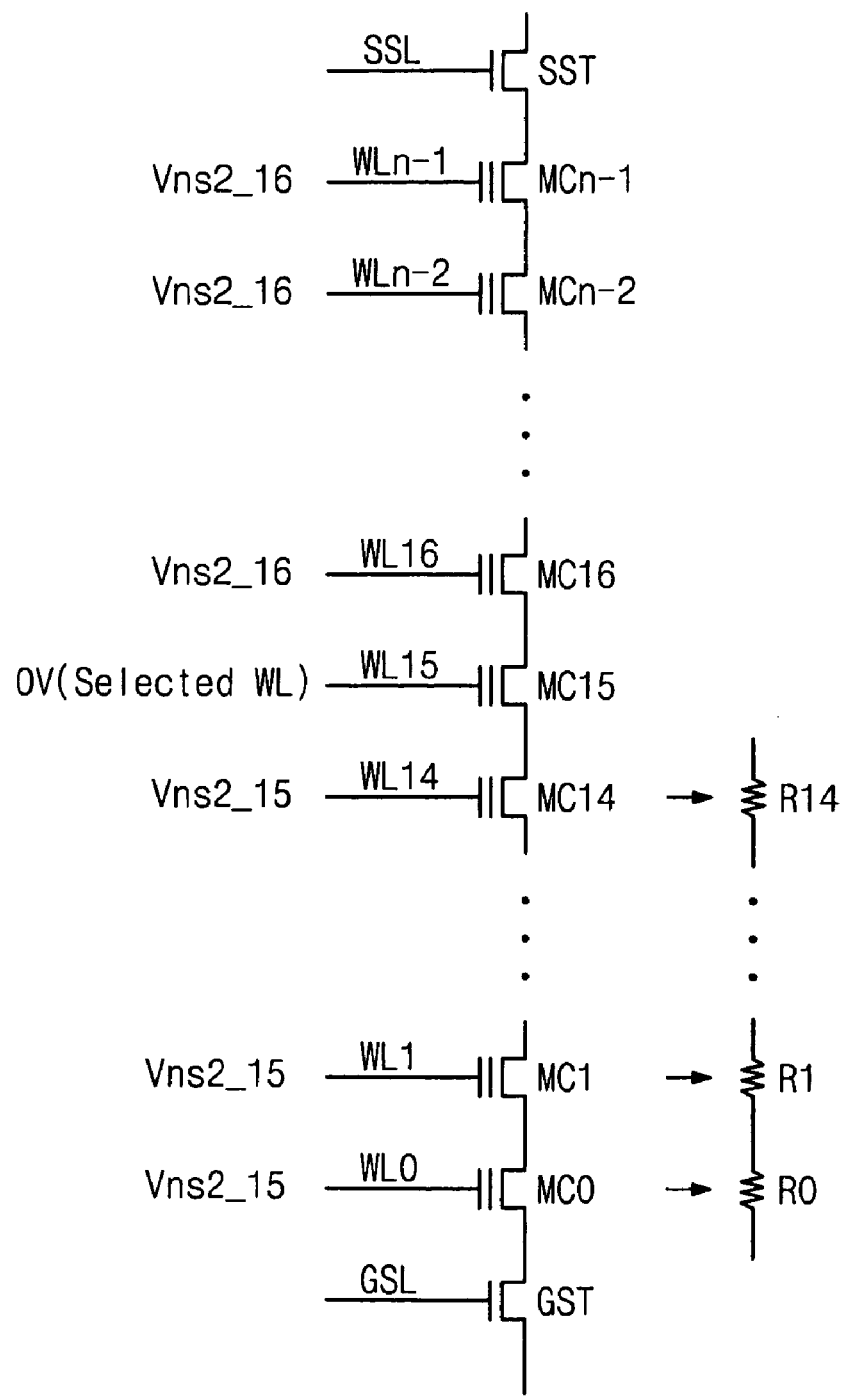
Figure 9:
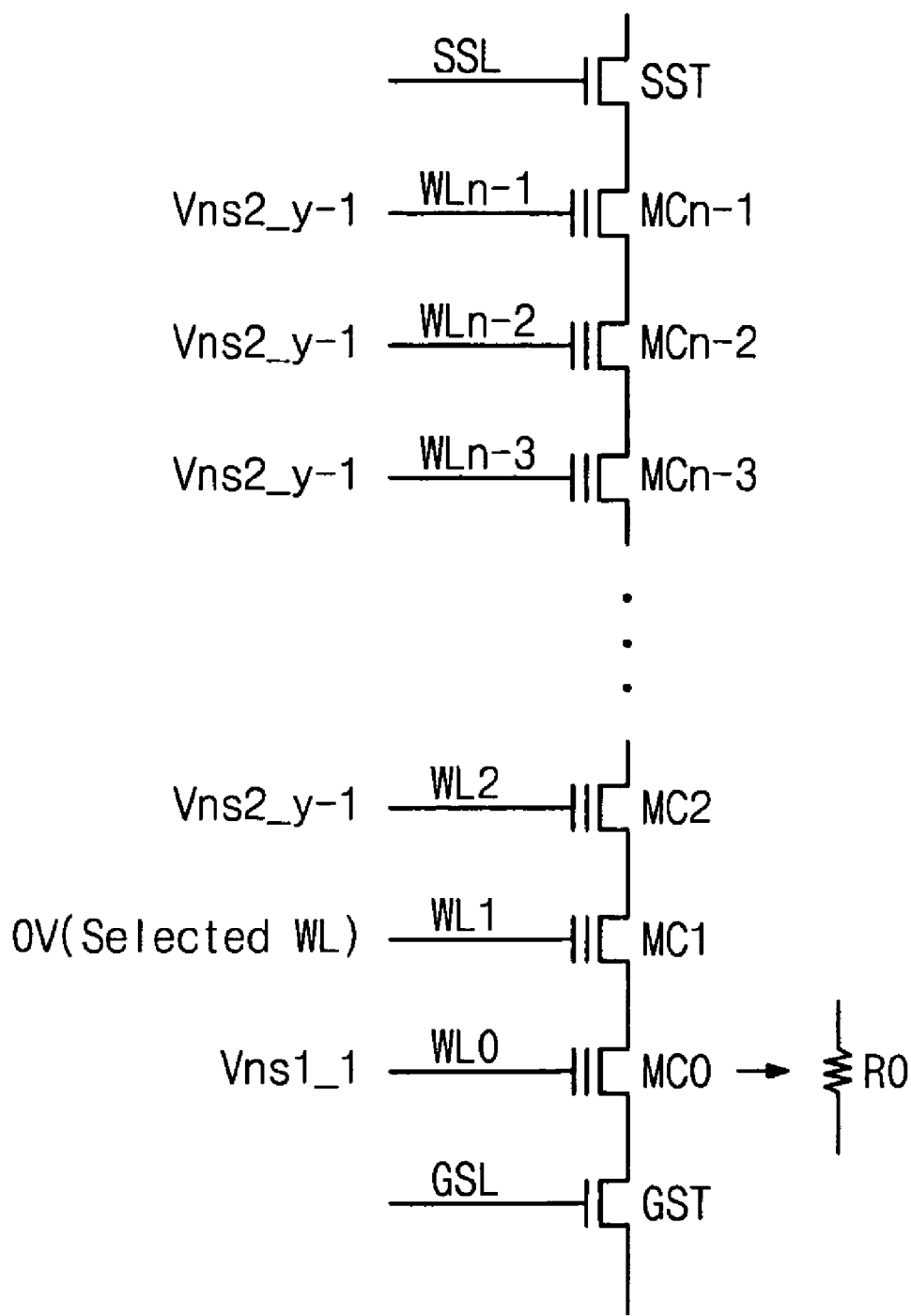

FIGS. 7 through 9 show different bias conditions based on the location of a selected word line in accordance with another embodiment of the present invention. Also, arbitrary cell strings in memory cell array 110 are shown for descriptive purposes. The range Vns1_1~Vns1_K illustrate the varying levels of first non-selection voltage Vns1. Also, the range Vns2_1~Vns2_Y illustrate the varying voltage levels of a second non-selection voltage Vns2. The voltage levels in range Vns2_1~Vns2_Y increase incrementally from Vns2_1 to Vns2_L.

The operational features corresponding to first non-selection voltage range Vns1_1~Vns1_K are the same as described in FIGS. 3 through 6, so it is not discussed in further detail.

Non-selected memory cells coupled to the drain channel of a selected memory cell may also act as conductive resistors. This conductive resistance (drain resistance) may cause a current drop to the selected memory cell. However, such current drop may not heavily affect the gate-source potential gap of the selected memory cell. Thus, even if the drain resistance increases, there is no considerable effect to the amount of current flowing to the selected memory cell.

As stated during the discussion on read disturbance, continuously applying the conventional non-selection voltage Vns to the control gate of a non-selected memory cell causes a weak electron flow between the floating gate and a channel of the non-selected memory cell. If the non-selected memory cell is an erased cell subject to soft programming, its threshold voltage may be higher than the ground voltage. If this is true, read disturbance may occur when the non-selected memory cell is inadvertently detected as an on-cell. However, if a voltage lower than the conventional non-selection voltage Vns is applied to the non-selected memory cells, such read disturbance would fall away.

Normally, non-selected memory cells have a resistance value that increases as the voltage applied to their respective control gates increases. When a word line is selected, the row selection circuit 120 applies a first non-selection voltage Vns1 that is greater than the conventional non-selection voltage Vns. Also, row selection circuit 120 applies a second non-selection voltage Vns2 that is lower than the conventional non-selection voltage Vns. The voltage levels of the first non-selection voltage Vns1 and the second non-selection voltage Vns2 are inversely proportional. For example, the greater the voltage applied to the word lines associated with memory cells subsequent to the selected memory cell (Vns1), the lower the voltage applied to the word lines associated with memory cells prior to the selected memory cell (Vns2), and vice versa. The second non-selection voltage Vns2 applied to the prior word lines reduces the probability of read disturbance.

FIGS. 7 through 9 illustrate bias conditions applied to non-selected word lines according to an example embodiment, wherein the first non-selection voltage Vns 1 and the second non-selection voltage Vns2 are applied to non-selected word lines depending on the location of the selected word line.

During a reading operation, if the selected word line is word line WLn-1 (not shown), then there are no the word lines associated with memory cells prior to selected memory cell MCn-1. In such a situation, the bias condition applied to the non-selected word lines is the same as FIG. 6, which applies a first non-selection voltage Vns1 to all the word lines associated with memory cells subsequent to the selected memory cell.

However, referring to FIG. 7, if the selected word line is word line WLn-2, then the word line associated with memory cells prior to the selected memory cell is WLn-1. The source resistance on selected memory cell MCn-2 remains large, as the source resistance is the combined resistance value R0~Rn-3 caused by the subsequent non-selected memory cells MC0~MCn-3. Accordingly, the first non-selection voltage applied to the subsequent non-selected word lines is Vns1_K-1, which is the only voltage value in the first non-selection voltage range that is less than Vns1_K. On the other hand, the second non-selection voltage Vns2 applied to the single prior non-selected word line WLn-1 is Vns2_1, which is the lowest value in the range of second non-selection voltages Vns2_1~Vns2_Y.

In the bias condition illustrated in FIG. 8, the selected word line is word line WL15, which may be equidistant from the string selection line SSL and the ground selection lines GSL. In such a scenario, the source resistance of selected memory cell MC15 is smaller than the bias condition illustrated in FIG. 7. A first non-selection voltage Vns1_15 is applied to word lines WL0~WL14, which are the word lines associated with the memory cells subsequent to the selected memory cell MC15. Accordingly, in FIG. 8, the decreased number of non-selected memory cells subsequent to the selected memory cells translates to a lessened source resistance (R0~R14). A second non-selection voltage Vns2_16 is applied to the word lines WL16~WLn-1, which are associated with memory cells prior to the selected memory cell MC15. Second non-selection voltage value Vns2_16 is from the range of second non-selection voltages Vns2_1~Vns2_k.

In the bias condition illustrated in FIG. 9, the selected word line is word line WL1, which corresponds to the source resistance value being only R0, the resistance value correlating with the subsequent non-selected memory cell MC0. Accordingly, a first non-selection voltage Vns1_1, the lowest possible, is applied to the word line associated with the single memory cell subsequent to the selected memory cell MC1. In contrast, a second non-selection voltage Vns2_Y-1, is applied to the word lines WL2~WLn-1, which are prior to selected memory cell MC1. The second non-selection voltage Vns2_Y-1 is the second highest one among the range of second non-selection voltages Vns2_1~Vns2_Y, To summarize FIGS. 7 through 9, the voltage level of a first non-selection voltage Vns1 applied to word lines associated with memory cells subsequent to a selected memory cell is inversely proportional to the voltage level of the second non-selection voltage Vns2 applied to word lines associated with the memory cells prior to a selected memory cell. This relationship lessens read disturbance from the prior non-selected memory cells and lowers source resistance.

The aforementioned descriptions of a reading operation in flash memory device 100 show how reliability of the reading operation may be improved, as well as how read disturbance may be reduced.

Figure 10:
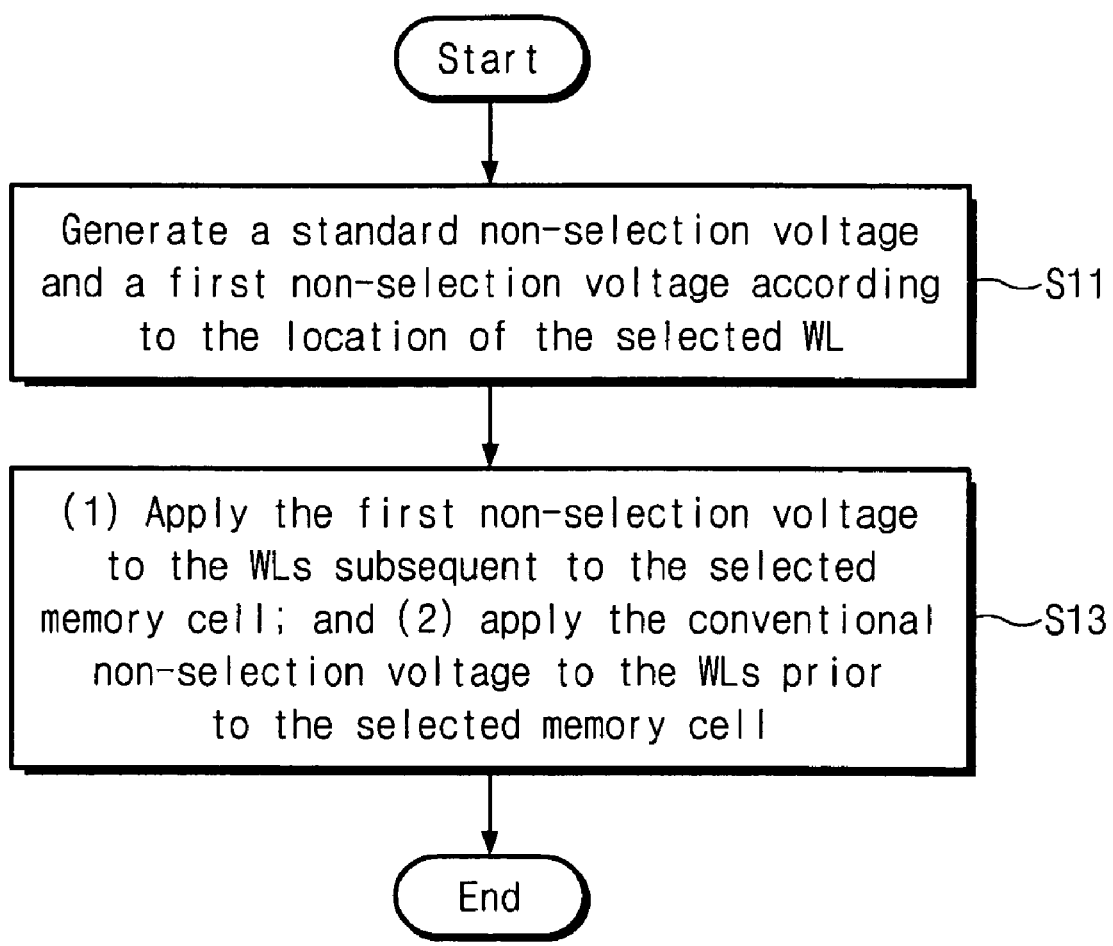
FIG. 10 is a flow chart showing a reading operation of a flash memory system in accordance with an example embodiment.

FIG. 10 is a flow chart illustrating a reading operation in accordance with an example embodiment. The reading operation may be performed by a flash memory device. As shown, in step S11 a flash memory device generates the conventional non-selection voltage Vns and a first non-selection voltage Vns1. The voltage level of first non-selection voltage Vns1 varies between the range Vns1_1~Vns1_K, in which Vns1_1 is the lowest possible voltage level and Vns 1_K is the highest.

In Step S13, the flash memory device applies the first non-selection voltage Vns to the word lines associated with the non-selected memory cells subsequent to the selected memory cell. The conventional non-selection voltage Vns is applied to the word lines associated with the non-selected memory cells prior to the selected memory cells. As stated before, the level of the first non-selection voltage Vns1 correlates with the source resistance caused by the subsequent non-selected memory cells. In particular, as the selected word line gets closer to the string selection line SSL, the first non-selection voltage increases in order to address the increasing number of non-selected subsequent memory cells causing source resistance.

In summary, generation of a first non-selection voltage reduces source resistance to a selected memory cell caused by subsequent non-selected memory cells in a cell string. This operation reduces the drop in current caused by source resistance. Thus, the reliability of the reading operation by flash memory device 100 is enhanced.

Figure 11:
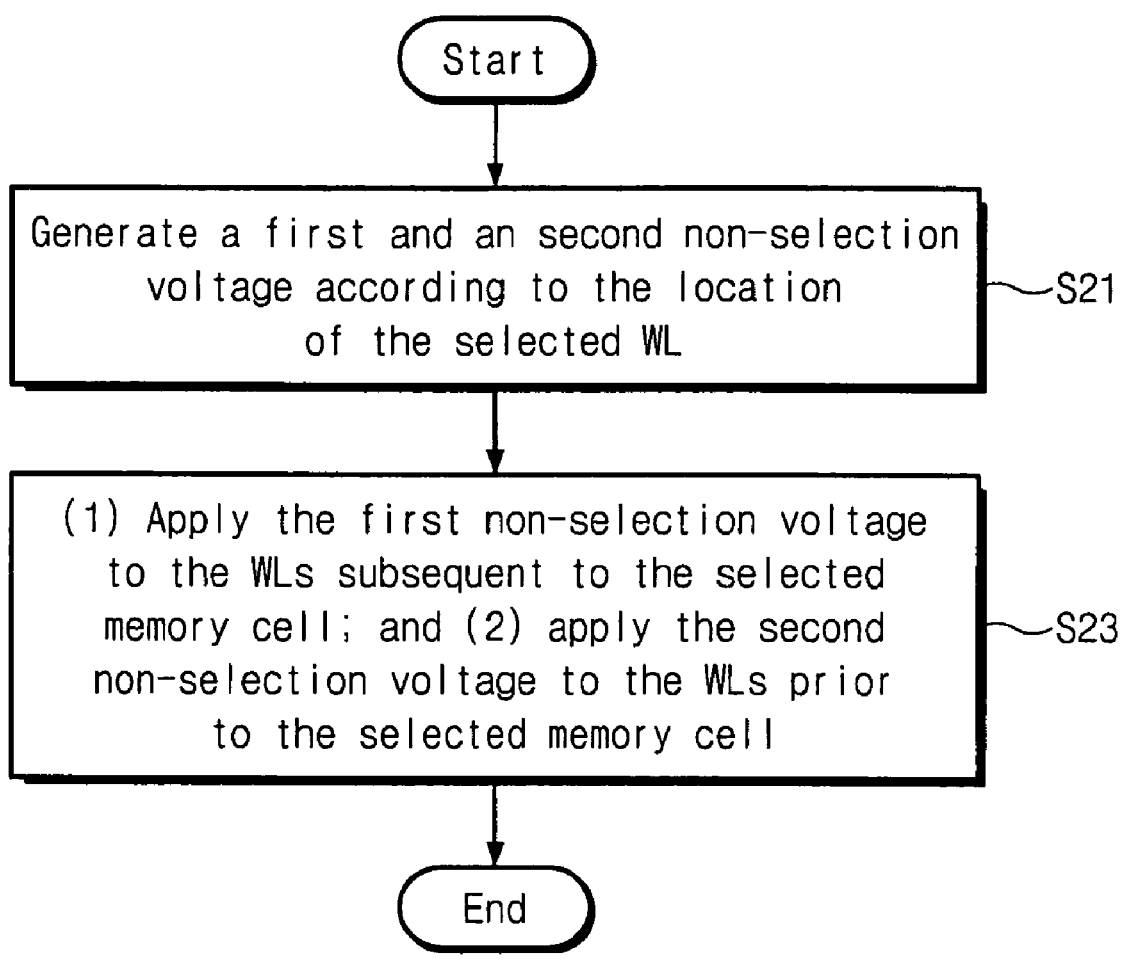
FIG. 11 is a flow chart showing a reading operation of a flash memory system in accordance with another example embodiment.

FIG. 11 is a flow chart illustrating a reading operation in accordance with another example embodiment. The reading operation may be performed by a flash memory device. As shown, in step S21 a flash memory device generates a first non-selection voltage Vns1 and a second non-selection voltage Vns2. The voltage level of first non-selection voltage Vns1 is between the range Vns1_1~Vns1_K, the exact value being determined by the location of a selected word line. Vns1_1 is the lowest voltage level and Vns1_K is the highest. The voltage level of second read voltage Vns2 is between the range Vns2_1~Vns2_Y, the exact value also being determined by the location of the selected word line. Vns2_1 is the lowest voltage level and Vns2_Y is the highest.

In Step S23, the flash memory device applies the first non-selection voltage Vns1 to the word lines associated with the non-selected memory cells subsequent to the selected memory cell, and applying the second non-selected voltage Vns2 to the word lines associated with the non-selected memory cells prior to the selected memory cell. The voltage level of the first non-selection voltage corresponds with the source resistance caused by the subsequent non-selected memory cells. The closer the selected memory cell is to the string selection line SSL, the greater the number of subsequent non-selected memory cells, and likewise the greater the first non-selection voltage Vns1 applied. The voltage level of the second non-selection voltage Vns2 has an inversely proportional relationship to the first non-selection voltage Vns1, such that the second non-selection voltage Vns2 decreases as the first non-selection voltage Vns1 increases.

In summary, to reduce source resistance of a selected memory cell and the likelihood of a read disturbance, the first non-selection voltage Vns1 is applied to the non-selected word lines subsequent to the selected memory cell, and the second non-selection voltage is applied to the non-selected word lines prior to the selected memory cell.

Figure 12:
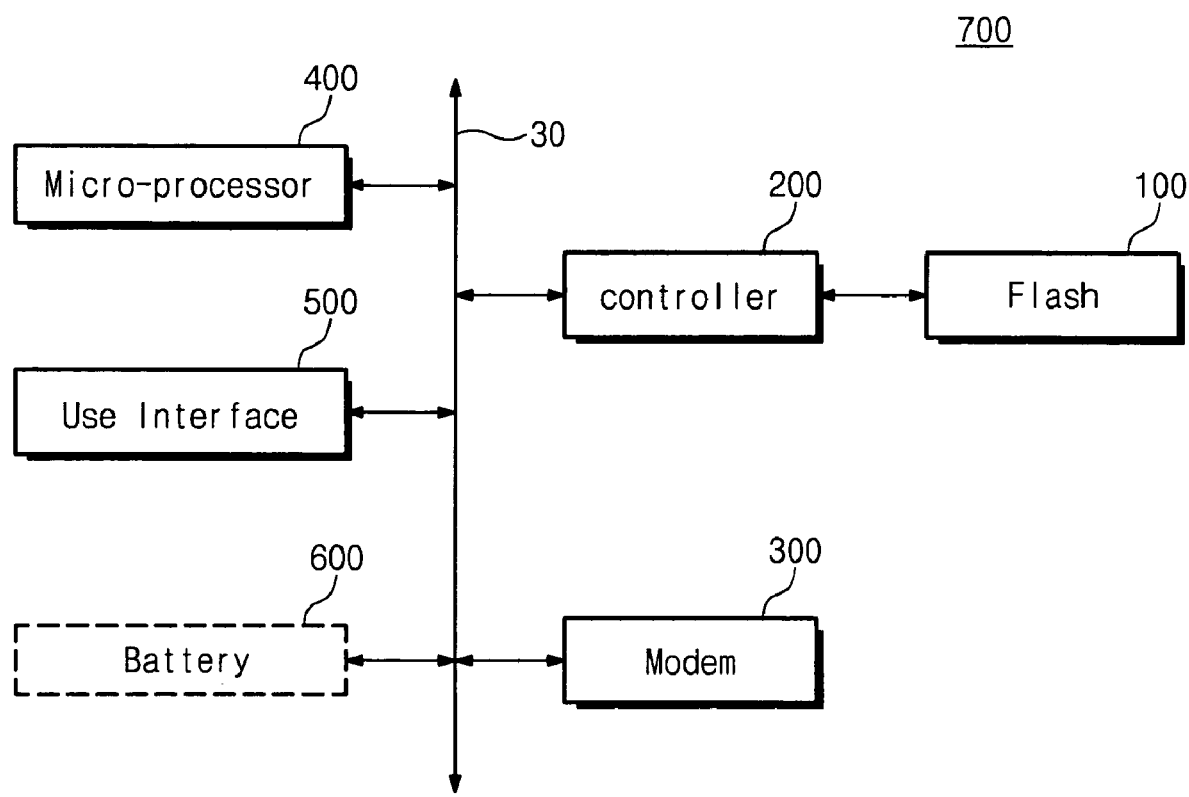
FIG. 12 is a block diagram of a computing system with a flash memory device according to an example embodiment.

FIG. 12 is a block diagram of a computing system with a flash memory device according to an example embodiment.

Flash memory devices are a type of nonvolatile memory capable of keeping data stored therein even without a power supply. With the rapid increase in use of mobile apparatuses (e.g. cellular phones, personal digital assistants (PDA), digital cameras, portable gaming consoles, and MP3), flash memory devices are being widely employed as code storage, as well as data storage. Flash memory devices may be also utilized in home applications (e.g. high-definition televisions, digital versatile disks (DVDs), routers, and global positioning systems (GPSs)).

The schematic structure of a computing system including a flash memory device according to an example embodiment is illustrated in FIG. 12. Computing system 700 includes a microprocessor 400, a user interface 500, a modem 300 such as a baseband chipset, a flash memory controller 200, and the flash memory device 100. Flash memory device 100 may be configured the same as the example embodiment shown in FIG. 1. In the flash memory device 100, N-bit data (N is a positive integer) may be stored, wherein the processing is done by microprocessor 400 and memory controller 200 may control the operation. If computing system 700 is a kind of mobile apparatus, it may further comprise a battery 600 for supplying power thereto. Although not shown in FIG. 12, computing system 700 may be further equipped with an application chipset, a camera image processor (e.g., complementary metal-oxide-semiconductor (CMOS) image sensor; i.e., CIS), a mobile DRAM, etc.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory comprising:
   a memory cell array having memory cells arranged at intersections of word lines and bit lines such that at least one bit line is associated with a plurality of memory cells connected in series;
   a voltage generator configured to generate a selection voltage and at least a first non-selection voltage;
   a row selection circuit configured to drive the word lines based on at least the selection voltage and the first non-selection voltage; and
   a control circuit configured to control operation of the voltage generator and the row selection circuit such that the voltage generator generates at least the first non-selection voltage based on a location of a selected memory cell in the plurality of memory cells, the selected memory cell being a memory cell in the plurality of memory cells connected to the word line receiving the selection voltage, the control circuit configured to control the row selection circuit to apply the first non-selection voltage to the word lines associated with memory cells subsequent to the selected memory cell in the plurality of memory cells, and the control circuit configured to control the row selection circuit to apply a same second non-selection voltage to the word lines associated with memory cells prior to the selected memory cell in the plurality of memory cells regardless of the location of the selected memory cell.

2. The flash memory as set forth in claim 1, wherein the plurality of memory cells connected in series are between a string selection transistor and a ground selection transistor.

3. The flash memory as set forth in claim 2, wherein the control circuit is configured to control the voltage generator to increase the first non-selection voltage as the selected memory cell is located closer to the string selection transistor.

4. The flash memory as set forth in claim 2, wherein the control circuit is configured to control the voltage generator to decrease the first non-selection voltage as the selected memory cell is located closer to the ground selection transistor.

* * * * *